United States Patent
Shuster

(10) Patent No.: US 8,694,493 B2
(45) Date of Patent: *Apr. 8, 2014

(54) COMPUTER-IMPLEMENTED SEARCH USING RESULT MATCHING

(71) Applicant: Gary Stephen Shuster, Fresno, CA (US)

(72) Inventor: Gary Stephen Shuster, Fresno, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/776,478

(22) Filed: Feb. 25, 2013

(65) Prior Publication Data

US 2013/0166529 A1    Jun. 27, 2013

Related U.S. Application Data

(63) Continuation of application No. 12/469,174, filed on May 20, 2009, now Pat. No. 8,386,476.

(60) Provisional application No. 61/054,605, filed on May 20, 2008.

(51) Int. Cl.
*G06F 17/30* (2006.01)
*G06F 7/00* (2006.01)

(52) U.S. Cl.
USPC .......................... 707/722; 707/736; 707/748

(58) Field of Classification Search
None
See application file for complete search history.

(56) References Cited

U.S. PATENT DOCUMENTS

| | | |
|---|---|---|
| 6,601,075 B1 | 7/2003 | Huang et al. |
| 6,795,819 B2 | 9/2004 | Wheeler et al. |
| 6,829,606 B2 | 12/2004 | Ripley |
| 6,832,218 B1 | 12/2004 | Emens et al. |
| 7,082,428 B1 | 7/2006 | Denny et al. |
| 7,158,966 B2 | 1/2007 | Brill et al. |
| 2002/0138481 A1 | 9/2002 | Aggarwal et al. |
| 2005/0080771 A1 | 4/2005 | Fish |
| 2005/0102282 A1 | 5/2005 | Linden |
| 2005/0234879 A1 | 10/2005 | Zeng et al. |
| 2006/0242133 A1 | 10/2006 | Denny et al. |
| 2007/0005575 A1 | 1/2007 | Dai et al. |
| 2008/0104045 A1 | 5/2008 | Cohen et al. |

*Primary Examiner* — Ajay Bhatia
*Assistant Examiner* — Miranda Huang
(74) *Attorney, Agent, or Firm* — Novak Druce Connolly Bove + Quigg LLP; Jonathan Jaech

(57) ABSTRACT

A computer search system compares search results received for searches falling within a defined parameter envelope used for grouping search requests. The parameter envelope may be defined by various parameters, for example, time of search, origin or search request, language, or other non-keyword data associated with each search request, excluding keywords used to define the search. Each new search result (comprising a list of search hits) for incoming search requests is compared to stored search results for search requests within the same parameter envelope. Search results that are found to be similar based on a pre-defined similarity measure are provided as related search results responsive to the incoming search requests. A client-side pseudo-browsing application may control interactions with the search engine, collecting true browsing input from the client and providing pseudo-browsing information to the search engine or other information provider.

9 Claims, 2 Drawing Sheets

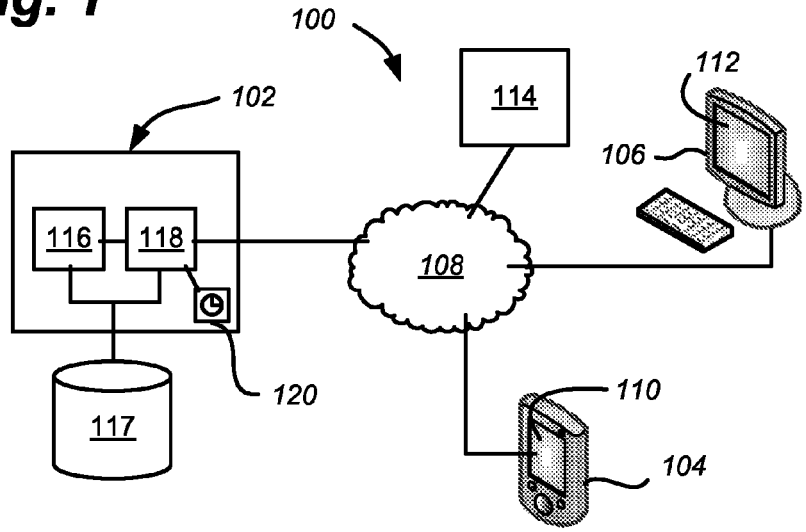
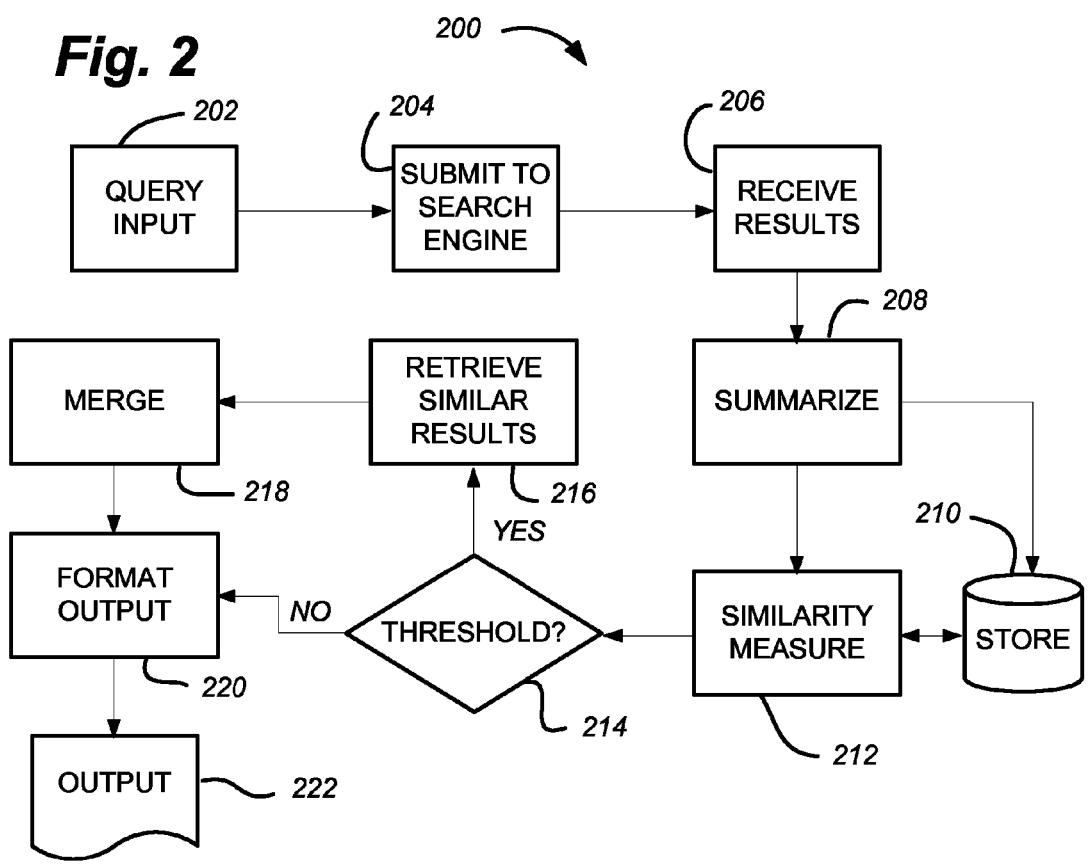

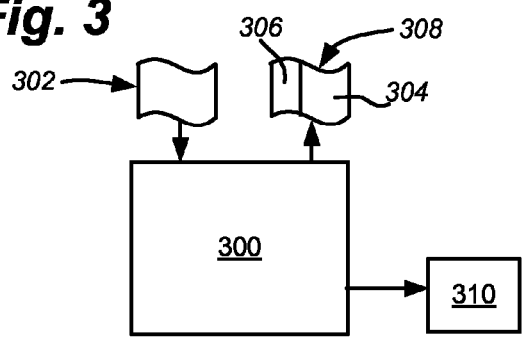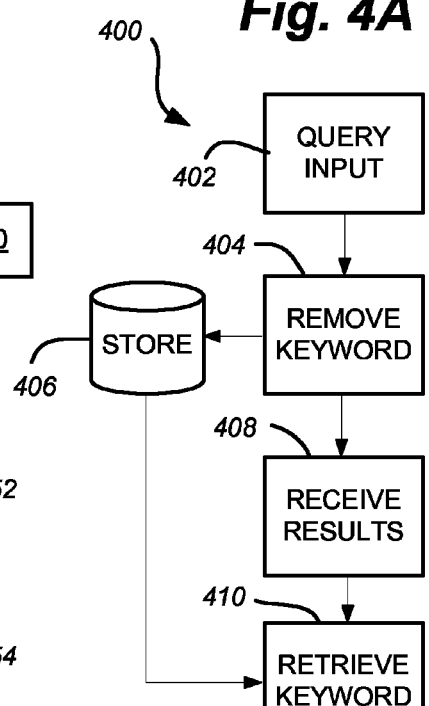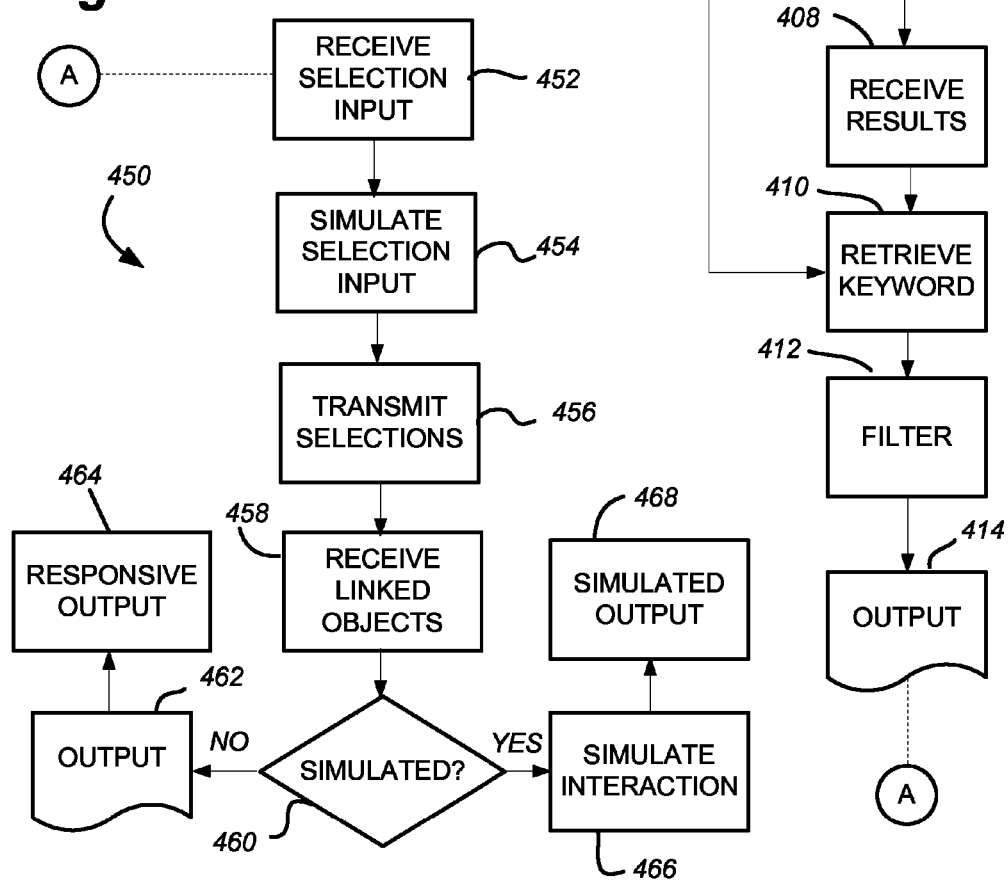

COMPUTER-IMPLEMENTED SEARCH USING RESULT MATCHING

CROSS-REFERENCE TO RELATED APPLICATION

This application is a continuation of U.S. application Ser. No. 12/469,174 filed May 20, 2009, now U.S. Pat. No. 8,386,476, claims priority pursuant to 35 U.S.C. §119(e) to U.S. provisional application Ser. No. 61/054,605 filed May 20, 2008, which applications are specifically incorporated hereby by reference, in their entireties.

BACKGROUND

1. Field

This application relates to query-based computer searching and to managing communication between a client and a server.

2. Description of Related Art

Users of search engines and other data retrieval systems often input search queries that do not return the desired data. The absence of a single key term, for example, or the choice of a different search term, might cause the query not to return one or more of the most relevant results.

Many search queries, although phrased differently, are effectively synonymous. That is, users draft queries for search engines using different terms while seeking the same information. Thus, for example, a search query using the key words "fastest route Westwood to LAX" may seek the same information as a query using the words "quickest way to Los Angeles International from UCLA." In many cases, such as the foregoing example, the use of an automated thesaurus or other processing of the search query input will not sufficiently equate the queries as to permit the queries to be treated as seeking the same information. However, because of the ability of known search methodologies that do not rely solely on text-matching (such as the link-back algorithm used by Google™), even very differently phrased queries seeking the same information will return many of the same results. For example, the first query described above might return many of the same "hits" as the second query, while omitting a page hosted at UCLA.edu that contains the most relevant data of all. In this example, then, search queries seek the same information, but the highest ranked result (measured such as by using Google's page rank or a voting ranking system) is not returned in response to both queries. It would be desirable to decrease or eliminate such arbitrary differences in results to differently-worded search queries that are seeking the same or similar information.

In addition, search engines and other information servers currently gather and process information describing past search queries or other information requests received from specified clients. This information is often used to construct user preference profiles for the users of the clients, for marketing or other purposes. However, some users do not desire to have such preference profiles constructed or use, preferring to keep information concerning their personal interests private. Therefore, it would also be desirable to provide a system that enables use of search engines and other information services, while protecting the user from disclosure of personal interests or preferences reflected in the user's information requests.

SUMMARY

Novel computer-implemented methods and systems are disclosed herein to provide more consistent search results in response to similar search queries. These novel methods and systems share certain novel common characteristics. For example, the disclosed novel methods share a characteristic of analyzing and comparing search result sets returned by a search engine in response to different search queries. This analysis and comparison may be performed systematically for each query submitted to the search engine, generating systematic query response data (result sets) that are maintained in appropriate system data storage. The result sets may comprise unique identifiers for each search result, for example, a URL.

The result sets are systematically compared using a computer-implemented comparative algorithm to identify synonymous, largely synonymous, or likely synonymous search queries, based on a logical premise that similarity between search results returned by a particular search engine is directly related to similarity between search queries. The algorithm may generate a quantified measure of similarity between sets, for example, a ratio between twice (2×) the number of common members and the total number of results in the two result sets. This would yield a ratio of 1 (100%) for identical sets, zero (0%) for sets with no members of common, and some number between zero and one for all other set comparisons. Other similarity measures may also include a comparison of where particular results are ranked in the set, as well.

The similarity measure may then be used as a determinant for merging similar result sets when responding to different queries. For example, supposing Query 'A' is defined using the key words "fastest route Westwood to LAX," while Query 'B' is defined using the words "quickest way to Los Angeles International from UCLA." A search engine receiving Query 'A' may process the query to obtain a Result Set 'A' consisting of ranked target items. The search engine or related process may process Result Set 'A' to develop a compressed signature of the search results. A comparison process may then rapidly compare the compressed signature of Result Set 'A' with an index of stored compressed signatures for past search results, and quickly identify a similar signature for a Result Set 'B' previously generated in response to Query 'B.' The two signatures for sets 'A' and 'B' should pass a defined similarity threshold, for example, they may be more than 90% similar. In response to determining that the two result sets are sufficiently similar, the search engine may merge the two Result Sets 'A' and 'B', eliminating any duplicate results, to generate a final result set that is output as the query response. The user therefore receives a more complete but still topically well focused result, than would otherwise have been generated in response to Query 'A'.

In some embodiments, a search client may use a novel pseudo-browser application operating on the client to preserve client privacy concerning the client's search history. This may be useful to prevent third parties from discovering information reflecting client interests that the client considers to be private. The pseudo-browser may provide for client access to results contained in matching result sets, collecting true browsing input from the client and providing falsified or pseudo-browsing information to the search engine or other information provider. Preferably, the pseudo-browsing information has the same characteristics as true browsing data, but does not completely represent true browsing input. Therefore, although the search engine provides many search results to the client, it is prevented from obtaining accurate information about client preferences by recording user selections from search result lists. Such information is maintained privately between the client and the pseudo-browser.

The pseudo-browsing application may provide output as a menu interface, tabbed browsing interface, or other interface allowing selection of results by a user. The pseudo-browser may be configured to select and download "decoy information"—that is, information that is not actually responsive to a client query—from search result lists. The decoy information may be selected by a random or schematic process from so as to appear to represent choices by a user. The user may be able to interact with alternative rendered pages displayed by the pseudo-browsing application to view additional data or to further mislead the search provider as to the client operator's actual input that might reveal true private preferences. The speed with which the internally (non-displayed or alternative) rendered pages are downloaded, rendered, or automatically "clicked through" may be varied by a random amount, or a simulation of user interaction may be generated in simultaneous concert with the user's interaction with the displayed, non-alternative search results, in order to prevent the search provider from determining automated search result interaction and thereby gaining information useful to determining the user's private preferences.

Further details and variations of the foregoing technologies are presented in the detailed description below.

BRIEF DESCRIPTION OF THE DRAWINGS

The present invention, in accordance with one or more various embodiments, is described in detail with reference to the following figures. The drawings depict embodiments of the invention, by way of example.

FIG. 1 is a system diagram showing an example of a networked computer system configured to implement results matching in responding to computer search queries.

FIG. 2 is a flow chart showing an example of a method for using results matching to provide more consistent responses to similar search queries.

FIG. 3 is a system diagram showing an example of a pseudo-browser application to protect user privacy.

FIGS. 4A and 4B are flow charts showing examples of a method for managing a user interface to protect client privacy.

DESCRIPTION

An exemplary system 100 is shown in FIG. 1 to demonstrate application of the technology to a networked computer system. System 100 may comprise a search provider server 102 (or similar information provider) in communication with a plurality of clients 104, 106 (two of many shown) via a wide area network 108. Clients 104, 106 may comprise any suitable client system and related components, for example, personal computers, palm computers, cellular phones with Internet browsing capabilities, or other device. Clients generally include means for providing an audio-visual output to a user, such as, for example, display monitors 110, 112, printers, speakers, and associated components. Clients may also include suitable input means (not shown) such as, for example, keyboards, pointers, microphones, motion sensors, or the other user input devices.

Clients may include one or more computer memory devices storing application software including instructions for performing methods as described herein. The software may be operated by loading into a computer memory and operating in response to user inputs using one or more computer processors of the client device. The system may include a plurality of content servers 114 (one of many shown) providing digital content (e.g., Web pages or audio-visual content) for output by client devices in response to information request. The search server 102 may index available digital content and store a content index in a suitable database 117. In response to search queries from clients 104, 106, server 102 may use the index in database 117 to provide result sets to the clients. The result sets may generally include hyperlinks that may be selected to request information directly from content providers 114. Other filter and constraints may be applied to refine the search engine response, as described more fully below.

Information provider node 102 may include a result set comparator application or module 116 configured to operate cooperatively with a search engine application or module 118 to handle incoming search queries from clients 104, 106 and provide responsive search results. Additionally the search engine node 102 may be configured to capture query parameters for incoming queries, as discussed elsewhere herein, for use in determining parameter windows used to identify other result sets falling within defined query parameter windows.

The comparator 116 (alone or with other components of node 102) may be configured, for any given incoming query, to (a) receive a responsive first result set from the search engine 118; (b) determine a parameter window for the query; (c) obtain result sets from a database of prior search results each associated with query parameters, such as from database 117; (d) compare each of the result sets with the first result set to obtain a similarity measure; and (e) taking one of plural conditional actions depending on the value of the determined similarity measure. For example, if the similarity measure for a particular second result set when compared to the first result set is too low, the second result set may be ignored. Conversely, if the similarity is sufficiently high, the comparator may pass any unique results from the second result set to the search engine. The search engine may then provide the first result set, plus any unique entries (that is, entries not present in the first result set) from the second result set to the requesting client in response to the search query.

As noted a search provider system 102 may compare result sets to identify synonymous, largely synonymous, or likely synonymous search queries, based on a logical premise that similarity between search results returned by a particular search engine is directly related to similarity between search queries. For example, in embodiments of the invention, when search engine queries are responded to, the search engine server may store the result sets returned by the search engine in response to each of the queries. Any selected one of the result sets may then be compared to other result sets returned by the search engine within a defined time period ("time window"), which may extend to past, future, or both past and future periods.

It may be desirable to choose an appropriate limited time period to enhance the reliability of the search result comparison technique. Even identical searches may return different results if made at different times, and such divergence will generally increase as the time interval between the searches increases. Additional "parameter windows" similar in concept to the time window may be used to limit the search results compared, including without limitation: (a) A geographical window applied to users initiating the search queries; (b) A language window, similar to the geographical window; (c) an age window, i.e., based on the age or age group for a user originating the request, as determined from a user profile; (d) an ISP window or reverse DNS window, grouping people from identical or similar businesses or service providers; (e) an operating system and/or browser window, grouping people using similar technology, particularly in the context of technology-related queries; (f) a demographic window (using user-provided data or otherwise); (g) a search sophistication window, measuring how many searches the user normally does in a day, the normal efficacy of the user's searches, or other metrics; or (g) other useful differentiating user data.

A geographical window applied to users initiating the search queries may be determined using GEO-IP, browser language preferences, user provided data, or other methods to determine or estimate user location. This window may provide the benefit of preventing results for searches for geographically different but textually similar items from being grouped together. For example, a search for "Washington opera house", without this window, might group results from Washington DC with those from Washington State. Use of a geographic parameter window may avoid this erroneous result by distinguishing between the different "Washington" designations based on the geographic location of the client from which the search originates. Geographic location of the client may be estimated from its IP address or other connection architecture, or by using a locating device such as a GPS locator on the client side.

More generally, search results may be weighted toward geographically close items. That is, a geographical parameter window may be applied not only for search query comparison, but also for single-user search result weighting. Search results within the parameter window may be weighted more heavily than results for locations outside of the parameter window. The user may be provided with an option to disable geographical weighting for searches in which such weighting is not desirable, such as for searches seeking information about remote locations. In general, the parameter windows described herein may also be used to determine how to prioritize or obtain search results, with or without reference to synonymous results. For example, a user accessing from a ".edu" IP address (using reverse dns lookup) might see results with additional weighting toward those hosted at .edu URLs.

The data required to determine the parameter windows may include information learned from automatically transmitted or revealed data, such as IP address, browser or operating system data from client terminals submitting search queries, from user-provided data, or otherwise. Of course, a system clock 120 may be used to determine time-based parameter windows. The system current time or date for a submitted query may be compared to time or date-stamped result sets for queries submitted in the past.

When a query is made, the system 102 preliminarily retrieves current results, and/or retrieves past results if the same query has been made previously within a limited time window. The system locates other searches that are synonymous with returned results to greater than a specified amount, for example, 50% as measured by twice the number of identical results divided by the sum of all results in two sets, or other ratio, or a partial ratio, for example, as determined by "all result sets where the first 20 results contain at least 10 of the same results as this set contains." Any useful similarity measure may be used. From those synonymous results that do not appear within the original result set, results that have been highly ranked by users, that have a high "pagerank" if returned via a Google™ search engine, that have had high click-through rates, or are otherwise identified as having been valuable results in response to the synonymous queries, are added to the results page returned to the user. Optionally, they may be identified as from synonymous queries by an icon, text, visual element, or other indicator on the search result display. The synonymous queries and/or results from such queries may optionally be displayed, made available as a single link or a collapsed menu item, displayed in a separate section of the results, or otherwise.

Optionally, the search node 102 may enable clients to provide a user option to identify search result included from a matched result set (or any other search result) as not relevant to the instant query. Such a user option may be used to provide valuable feedback for weighing the relevance of individual results in otherwise matching result sets. Conversely, regardless of whether synonymous results are presented to the user for a particular query, the user may be offered to view queries that returned synonymous result sets. Such offers may be of use to the user in manually crafting additional search queries or in simply clicking through to in order to view the results to similar queries.

Optionally, system 102 may be configured to provide that a user may ask for a page consisting only of results from synonymous queries that are not present within the first "n" number of results to the instant query, wherein "n" is some integer number set by the system or selected by the user.

With regard to search queries that have been grouped together, whether by using one or more windows or simply a "window" that includes all queries, search results may be analyzed by the comparator 116. The results may be compared with other results within the relevant parameter window. Such comparison can take place immediately or the results or some representation of the results may be stored for later comparison, or both. Once compared, results that are more than a set amount similar (such amount of similarity to be set by the user, the provider, or both, in a manner that best serves the preferences of the user, provider, or both) may be identified as at least partially synonymous. Alternatively, or in addition, all results may be stored in a manner that permits selection of result sets of a synonymous nature, wherein an amount of synonymous match within a specified window or windows may be set or changed based on user input or other system input.

Optionally, the system may operate to not store queries or search results by search node 102 in response to user input indicating this choice, for privacy or other reasons. In addition, the system may optionally exclude queries and results that include specified types of personal information, such as matches for social security numbers (i.e. a regex of m/\d\d\-\d\d\-\d\d\d\d)/), credit card numbers, account numbers, secured pages, pages that included more than a set amount of user data in the GET request, all pages returned by POST requests or POST request results exceeding a set size, queries with names and/or names not recognized on a list of "public figures", or otherwise. Generally the search engine 102 may screen incoming queries to identify any queries that seek private information of a confidential nature, and treat such queries as not eligible to participate in result matching. The reason for this is to prevent other users from inadvertently discovering confidential identifying information that may be discernable from matched result sets for queries sharing common terms, e.g., "John Doe."

It is to be understood that query results may be limited to any number, by date, or any other criteria in order to generate a set that meets the needs of the user.

In addition, synonymous query data may be utilized to determine phrases that users view as synonymous. Such information may be "data-mined" or otherwise utilized in order to better target advertising, provide a useful phrase thesaurus, assist in automated translation tasks, or any other use.

In accordance with the foregoing, a search provider system, such as a computer server, may be configured to perform a method 200, as shown in FIG. 2, using any suitable programming technique. A computer-readable medium or device accessible by the computer may hold instructions, that when loaded into the computer processor, cause the computer to perform the actions shown in FIG. 2. The computer may comprise a client configured for receiving input from a user via a keyboard or other input device, or a server receiving input from one or more connected computers. At 202, the computer may receive query input, for example using a search interface including a form enabling entry of keywords, and optionally Boolean operators specifying relationships such as "AND," "OR," or "NOT" for the keywords, operating on a client. In response to completion of entry of keywords, phrases, and/or Boolean operators making up a query as signaled by a user, for example by selection of a "submit" button, the client may transmit the query to a search proxy server, which may receive the query 202 and transmit it 204 to a search engine operating on the server or on some other server.

The search engine may process the query in any suitable manner to obtain a list of search results. Each item in the list may comprise an address or link to an information object responsive to the query, and may include other information such as short excerpts from the listed information objects, metadata concerning each information object, or both. The search engine may transmit the search results to the computer, which receives them at 206.

Optionally, the computer may summarize the search result list 208 (also called a result set) to provide a more compact data file for comparison to other search result lists, to reduce storage requirements, increase comparison speed, and generally improve system efficiency. To "summarize," in the present context, refers to reducing the size of a data file without eliminating essential information, using any suitable compaction process. For example, the computer may remove duplicate or non-essential information from a result list, retaining only such information that is essential to identify a result, such as a URL or other network address for each search hit and its rank within the list. In the alternative, or in addition, the computer may transform a search result data file using a data compaction algorithm to prepare a compacted file expressing the information from the search result file in a more efficient data format. At 210, the computer may store the original search result list in a database or other data structure, for future use. The computer may manage stored data by deleting or archived older or rarely used result sets or their corresponding summary files, and avoiding storage of duplicate records. Separately, the computer may maintain a results tally to measure the popularity of particular result sets.

At 212, the computer may determine a similarity measure between a current result set and a stored database of prior result sets for past queries. In addition, the computer may first select the prior result sets that are to be compared or tested for similarity with the current result set, out of a larger collection of result sets. The computer may perform such selection by applying any one or combination of the parameter screens discussed above. For example, the sets for comparison may be selected as being generated within a designated time period of the current set, to avoid comparisons with result sets that are too old relative to the current set. For further example, result sets that are responsive to queries originating from clients outside a designated geographic area (e.g., the United States, or a particular region) may be eliminated from consideration for comparison. In the alternative, instead of entirely eliminating result sets subject to a parameter screen, the computer may apply a stricter standard of similarity for such sets.

As noted above, any measure of similarity may be used as inputs to a test 214 for identifying past query results that are sufficiently similar to the present result. Various examples are given in the discussion above. At 214, the computer identifies one or more result sets that pass a threshold similarity screen relative to the result set for that query input at 202.

At 216, the computer retrieves the corresponding result sets that were identified as similar to the present result set. The computer may retrieve stored result sets from a database, regenerate the result sets from summary data, or obtain new result sets for the corresponding queries used to obtain the original result sets. At 218, the computer may merge the original and similar result sets. Various examples of merging have been presented above. In a merge operation, the computer may identify results in the similar results sets that are not present in the original result set (i.e., unique result items), and create a merged set comprising the unique result items from the similar sets and all items from the original set, and avoiding inclusion of duplicate items. In addition, the computer may rank or classify the unique items for inclusion in the merged set relative to the original items.

At 220, the computer formats the merged set according to a defined template for presenting data results, for example as a web page. This function may be performed on the original result set immediately after the testing operation 214, if no similar result sets are identified by the test. As disclosed above, results may be formatted so that items added to the merged result set are indicated in some fashion, such as by being grouped together in a separate section, or by being marked with an icon or other marker signifying a result taken from a similar result set and not present in the original set. In the alternative, the added items may be formatted in a ranked list with the original items, with no indication that the added items were not present in the original results list. Finally, the computer may output a web page or other document containing the merged result set to a client for output to a display device, or directly to a display device.

Accordingly, more useful and consistent search results may be provided in response to user-formulated queries.

Protecting User Privacy

The collection and archiving of search result sets may create the potential for undesirable discovery of private information concerning user preferences and interests. In addition, may users may desire to maintain a level of privacy concerning queries submitted to a search engine, regardless of the methodologies employed by the search engine. Therefore, methods and systems for providing search results as described herein may be implemented so as to preserve user privacy concerning what subjects are of interest to the user. This privacy protection may be accomplished in various ways. FIG. 3 shows an exemplary system using a client-side application 300 for protecting client privacy in conjunction with a result-matching system as shown in FIG. 1. It should be understood that the application 300 may operate on any suitable client, for example on palm (portable) computer 104 or personal computer 106 as shown in FIG. 1. An apparatus for performing the described functions may therefore comprise a suitable client including a processor, memory, and programmed instructions 300 such as those computers described hereinabove.

The search engine may be configured to transmit a plurality of result sets 302 within the relevant parameter window to the browser 300, instead of and more than just a matching result set. "Browser" as applied to application 300 is merely a term of convenience, and does not limit application of the described functionality to a particular class of software. If may be convenient to incorporate the described functions in a browser application, or conversely, to implement in a separate application. Browser 300 (also called a "pseudo-browser" herein) may operate independently from the search engine and may be configured to appear to the search system to operate as any other prior-art browser configured to receive search results, although actually functioning differently from prior-art browsers.

In addition, the search engine may be configured to also transmit information for characterizing each set in the plurality of result sets, such as weighting or relevancy data or rankings, to enable software 300 in a memory of a client computer to select a set or sets of results to include as most relevant to a particular query. Thus, for example, a user searching for "dating services" may receive dating services results where each result is coded, to the extent possible, with information about the sexual orientation to which those services apply. The user's browser 300 may then filter the results according to the user's preferences (filter criteria), all without providing the filter criteria to the service provider. To further preserve user privacy the client-side browser may "internally render" pages for more than one set of user preferences, loading the images, iframes, and other data required to display the various result sets. Thereby the client will generate information requests 304 that are unrelated to the information actually selected by the user for viewing, and these unrelated "internally rendered" or "pseudo-" information requests will serve to screen or mask which content is actually of interest to the user. The browser 300 may further include information requests 306 related to information actually selected by the user for viewing, configured in a plurality of requests 308 so as to be indistinguishable in character from pseudo-requests 304.

In other words, application 300 operates so that a server system receiving the plurality of requests 308 is deprived of any secondary information that might be used to distinguish the actual requests 306 from the pseudo-requests 304. While the browser displays only the desired result set 310 to the user according to user-specified filter criteria, the filter criteria is not provided to the search provider and is instead maintained only at the client terminal. Therefore, it is not possible for the search provider to use data about which result set was rendered in order to discern the user's private preferences. For example, the browser 300 may operate to retrieve the first, second, random, or other one or more of the linked search results from each of the internally rendered result sets, thereby further preventing the search provider from discerning the user's private preference by tracking click-throughs, surreptitiously including fake sites within the results for the purpose of getting the user to click and thereby reveal his internal preference, or otherwise. It is to be understood that when "user computer" or "client" is referenced above, it may comprise a proxy server which serves more than one user and thereby makes it even more difficult to track the query back to the user in a manner that could reveal the user's private preferences.

More generally, to prevent a search engine or other information provider from collecting client preference information without a user's consent, the client-side pseudo-browsing application 300 may operate between the search engine and a true client browser. The pseudo-browser may provide for client access to results contained in matching result sets, collecting true browsing input from the client and providing simulated or pseudo-browsing information to the search engine or other information provider. Preferably, the pseudo-browsing information resembles true browsing data, but does not accurately represent true browsing input to the client browser. Therefore, although the search engine provides many search results to the client, it is prevented from obtaining accurate information about client preferences by recording user selections from search result lists.

The pseudo-browsing application may provide output as a menu interface, tabbed browsing interface, or other interface allowing selection of results by a user. The pseudo-browser may be configured to select and download decoy information from search result lists. The decoy information may be selected by a random or schematic process from so as to appear to represent choices by a user; such information may be referred to as simulated user selection data and the process of generating the simulated information as simulating user selections. The user may be able to interact with alternative rendered pages displayed by the pseudo-browsing application to view additional data or to further mislead the search provider as to the client operator's actual input that might reveal true private preferences. The speed with which the internally (non-displayed or alternative) rendered pages are downloaded, rendered, or automatically "clicked through" may be varied by a random amount, or the simulation of user interaction may be generated in simultaneous concert with the user's interaction with the displayed, non-alternative search results, in order to prevent the search provider from determining automated search result interaction and thereby gaining information useful to determining the user's private preferences.

In the alternative, the technology as described above may be adopted for use with ranking sites such as digg.com, internet directories, or any site where user privacy may be compromised by a content provider tracking personal data and/or IP address in conjunction with clicked links. To clarify that a pseudo-browser technique is being used, if desired, the user may optionally transmit such information to the information provider, such as by modifying a browser type variable in transmitted HTTP headers or identifying the same in the reverse DNS of the user computer or proxy. It is further to be understood that the present technology may apply to any data interaction device or function or data retrieval or query device or function, and is not limited to web browsers.

FIG. 4A shows one example of a pseudo-browsing method 400 that may be implemented on a computer client in connection with use of a search engine. At 402, the client may receive query input, comprising at least two keywords. At 404, the client may select at least one of the keywords, and generate a second query comprising all of the keywords from the first query, except for the one or more keywords selected for removal. Selection may be performed in response to user input designating one or more keywords as "private" and not to be submitted to a search engine. The client may store 406 the one or more keywords selected for removal in a client memory or database. The client may then submit the second query to an external search engine.

At 408, the client may receive results responsive to the second query from the external search engine. In response, the client may retrieve the stored one or more keyword 410 from memory. The client may then filter the results with the removed and stored keyword or keywords, to obtain filtered results that are responsive to both the keywords in the second query and the removed keywords. The client may then output the filtered results to a display device or other output device as responsive to the query input at 402. The client may thereby provide responsive results without supplying complete query information to the search engine.

FIG. 4B shows a second method 450 that may be coupled with method 400, or in the alternative, may operated independently of method 400 on any information set that includes interactive links or other objects for requesting further information, for example, a web page containing interactive objects. An example of such as web page is a search result list containing a list of hyperlinks. Such a page may be displayed on an display device of a client at the initiation of method 450 by the client.

At 452, the client may receive selection input responsive to the displayed web page or other interactive object. The selection input may be cached at the client and transmitted 456 to a server at times selected by a simulation algorithm operating on the client. At 454, which may be performed before, after, and/or while receiving the selection input, the client may simulate selection input by processing the page or object using an algorithm that randomly or using some predetermined scheme, or a combination of random and predetermined schemes, activates selection objects on the web page. The simulated selection input may be cached at the client or transmitted 456 immediately after it is generated to a server. The client pseudo-browser application may intersperse and pace the transmittal of user selections and simulated user selections so that it is difficult or impossible to reliably distinguish actual and simulated selections at the server end. However, the client maintains a record of the simulated selections, the actual user selections, or both at the client level, for use in processing responsive objects received from the server.

At 458, the client may receive linked objects or information (content) responsive to the user selections and the simulated selections, in accordance with normal operation of the links. At 460, the client may determine which of the linked content is responsive to simulated selections or user selections, such as by reference to a record of user selections or simulated selections maintained in a client memory. For content that the client determines is received in response to a user selection, the client may output the content 462 in a conventional fashion. The content will generally include responsive links to further content, and thus the client may renew the cycle at 452 for the delivered content, in response to output 464 from the delivered content generated by further user selection of links.

For content that the client determines is received in response to a simulated selection, the client may optionally simulate some further interaction with such content 466. For example, the client may selection some link on the content using a random or schematic algorithm. In turn, such simulated selection may lead to further simulated output 468 which may be directed to the server, causing additional content responsive to the simulated selection to be received 458. This may create an endless loop of ever-increasing simulated selections and responsive content that could quickly overwhelm the system, if not managed appropriately. However, it should be relatively easy to manage the simulation process so that it does not overwhelm system resources. For example, a governor mechanism may be programmed into the system that prevents the rate of simulated selections at the client from exceeding a defined proportion of the actual user selections. Whether this is ten time the number of user selections, one times the number of user selections, or some other ratio may depend on a desired balance between privacy, efficiency for the available network and computing resource.

FIGS. 4A and 4B exemplify methods for implementing a pseudo-browsing application as described herein. Other methods may also be suitable in accordance with the inventive principles of the present disclosure. Users may thereby obtain information from a computer network while masking and/or withholding information from which the user's actual information interests may be ascertained.

What is claimed is:

1. A method comprising:
counting, by a computer, a number of identical result items included in each of a first query result responsive to a first query and in multiple prior query results responsive to prior queries each distinct from the first query;
computing, by the computer, a ratio between twice the number of identical result items and a count of total result items in the first query result and in respective ones of the multiple prior query results;
identifying, by the computer, unique result items in one or more of the multiple prior query results for which the ratio exceeds a defined threshold, wherein the unique result items are not included in the first query result; and
combining, by the computer, the first query result and the unique result items as a combined search result responsive to the first query.

2. The method of claim 1, further comprising formatting the combined search query so that the unique result items are presented in a rank order interspersed with items of the first query result.

3. The method of claim 1, further comprising formatting the combined search query so that the unique result items are presented with a visible indicator to indicate that the unique result items were not returned by the search engine in response to the first query.

4. The method of claim 1, further comprising formatting the combined search query so that the unique result items are presented in a separate section from the first query results.

5. The method of claim 1, further comprising determining a difference in rank for the identical result items between the first query result and in the each of the multiple prior query results.

6. The method of claim 1, further comprising selecting the multiple prior query results by applying a filter to a larger set of prior query results.

7. The method of claim 6, further comprising selecting the multiple prior query results by applying the filter to select results within a defined time window of the first query.

8. The method of claim 6, further comprising selecting the multiple prior query results by applying the filter to select results within a defined geographic region associated with a source for the first query.

9. The method of claim 1, further comprising generating an index for comparing the first query results to the multiple prior query results.

* * * * *